(12) United States Patent
Gau

(10) Patent No.: US 6,255,168 B1
(45) Date of Patent: Jul. 3, 2001

(54) METHOD FOR MANUFACTURING BIT LINE AND BIT LINE CONTACT

(75) Inventor: Jing-Horng Gau, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/394,637

(22) Filed: Sep. 13, 1999

(51) Int. Cl.[7] ................................................. H01L 21/336
(52) U.S. Cl. ........................ 438/262; 438/617; 438/618
(58) Field of Search .................................. 438/253, 254, 438/279, 257, 241, 256, 258, 262, 617, 618

(56) References Cited

U.S. PATENT DOCUMENTS 5,741,722 * 4/1998 Lee .......................................... 437/60
6,071,804 * 6/2000 Gau ....................................... 438/618
6,096,594 * 8/2000 Lin et al. .............................. 438/238

* cited by examiner

Primary Examiner—David Nelms
Assistant Examiner—David Vu
(74) Attorney, Agent, or Firm—Charles C. H. Wu; Charles C. H. Wu & Associates

(57) ABSTRACT

A method for manufacturing a bit line and a bit line contact. A semiconductor substrate having a word line thereon is provided. Oxide spacers are formed on the sidewalls of the word line. A dielectric layer that covers the word line is formed over the entire substrate. A cap layer is next formed over the dielectric layer. The cap layer and the dielectric layer are patterned to form a trench in the dielectric layer. Silicon nitride spacers are formed on the sidewalls of the trench. In the subsequent step, the dielectric layer is etched down the trench to form a contact window that exposes a portion of the substrate. Polysilicon material is deposited into the contact window to form a polysilicon plug, and then metal silicide material is deposited into the trench above the plug to form a metal silicide layer.

13 Claims, 4 Drawing Sheets

METHOD FOR MANUFACTURING BIT LINE AND BIT LINE CONTACT

BACKGROUND OF THE INVENTION

1. Field of the Invention

The present invention relates to a method for manufacturing a bit line. More particularly, the present invention relates to a method for manufacturing a bit line and a bit line contact.

2. Description of the Related Art

To isolate a bit line contact inside an alignment window from a word line, a silicon nitride spacer is usually formed on the sidewall of the word line. The spacer is in contact with the sidewall of the word line as well as the silicon substrate. Due a difference in lattice constant between silicon nitride and polysilicon, considerable internal stress is created along the boundary between the silicon nitride spacer and the word line as well as between the silicon nitride spacer and the silicon substrate. Therefore, a large number of lattice defects are produced along their boundary regions.

FIGS. 1A and 1B are schematic cross-sectional views showing the steps for producing a conventional bit line and bit line contact above a substrate.

As shown in FIG. 1A, a word line 102 is formed above a substrate 100. The word lines 102 are formed by depositing a polysilicon layer 104 and a metal silicide layer 106 in sequence. In general, a silicon nitride layer 108 is also formed on the top surface of the word lines 102 serving as an additional protective layer. Silicon nitride spacers 110 are formed on the sidewalls of the word lines 102. The entire substrate 100 and the word lines 102 are covered by a dielectric layer 112. Utilizing the sidewall spacers 110, a self-aligned contact window 114 that exposes a portion of the substrate 100 is formed in the dielectric layer 112.

As shown in FIG. 1B, a polysilicon layer 116 that also fills the contact window 114 is formed over the dielectric layer 112. A metal silicide layer 118 (for example, a tungsten silicide layer) is formed over the polysilicon layer 116. Finally, polysilicon layer 116 and the metal silicide layer 118 are patterned to form a bit line.

In the aforementioned method of forming a bit line and a bit line contact, silicon nitride spacers are formed on the sidewalls of the word line. Due to stresses at the contact region between polysilicon and silicon nitride, many dislocations are formed, often resulting in the production of a large leakage current. In addition, the polysilicon layer 116 and the metal silicide layer 118 of the bit line are formed above the dielectric layer 112. Moreover, the silicon nitride layer 108 over the word line 102 also adds a little more thickness to the overall height of a memory cell unit. The resulting processing window of the method is therefore severely limited.

SUMMARY OF THE INVENTION

The invention provides a method for manufacturing a bit line and a bit line contact. A semiconductor substrate having a word line thereon is provided. Oxide spacers are formed on the sidewalls of the word line. A dielectric layer that covers the word line is formed over the entire substrate. A cap layer is next formed over the dielectric layer. The cap layer and the dielectric layer are patterned to form a trench in the dielectric layer. Silicon nitride spacers are formed on the sidewalls of the trench. In the subsequent step, the dielectric layer is etched via the trench to form a contact window that exposes a portion of the substrate. Polysilicon material is deposited into contact window to form a polysilicon plug, and then metal silicide material is deposited into the trench above the plug to form a metal silicide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
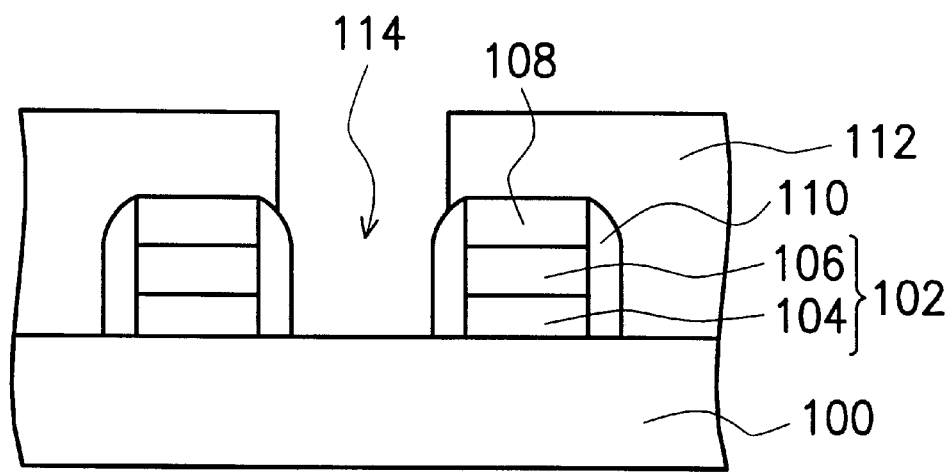
FIGS. 1A and 1B are schematic cross-sectional views showing the steps for producing a conventional bit line and bit line contact above a substrate.
Figure 1B:
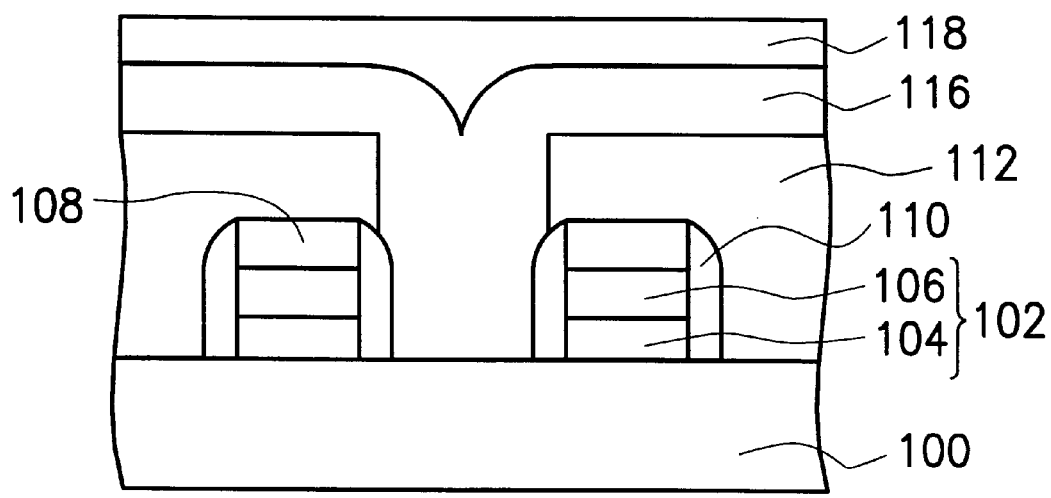

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic cross-sectional views showing the progression of manufacturing steps for producing a bit line and a bit line contact according to one preferred embodiment of this invention.

Figure 2A:
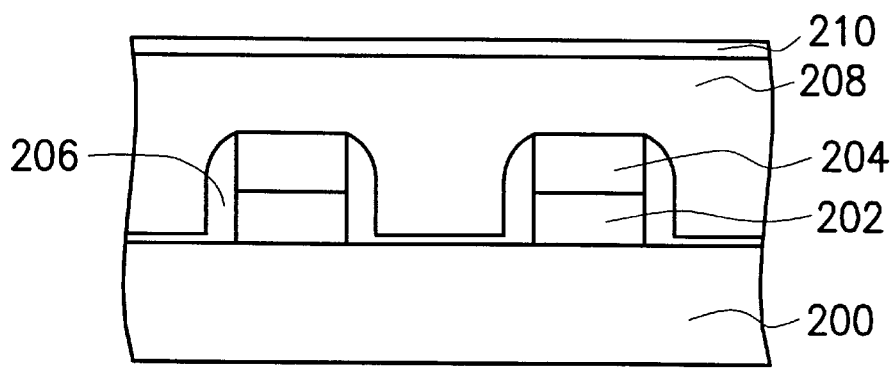
FIGS. 2A through 2F are schematic cross-sectional views showing the progression of manufacturing steps for producing a bit line and a bit line contact according to one preferred embodiment of this invention.

As shown in FIG. 2A, a substrate 200 having a polysilicon word line 202 thereon is provided. The word line 202 is generally covered by a metal silicide layer 206 such as tungsten silicide to increase its electrical conductivity.

Oxide spacers 204 are formed on the sidewalls of the word line 202 and the metal silicide layer 206. The oxide spacers 206 can be formed by, for example, performing a chemical vapor deposition to form an oxide layer (not shown in the figure) over the substrate 200 and the word line 202. This is followed by an anisotropic etching back of the oxide layer. Since the spacers 206 are made from silicon oxide whose stress with polysilicon and silicon substrate is smaller than silicon nitride, fewer dislocations are generated at their interfacial regions.

Dielectric material such as silicon oxide is deposited over the substrate 200 and the word line 202 to form a dielectric layer 208. The dielectric layer 208 can be formedby, for example, chemical vapor deposition. A cap layer 210 such as a silicon nitride layer is formed over the dielectric layer 208 by, for example, chemical vapor deposition.

Figure 2B:
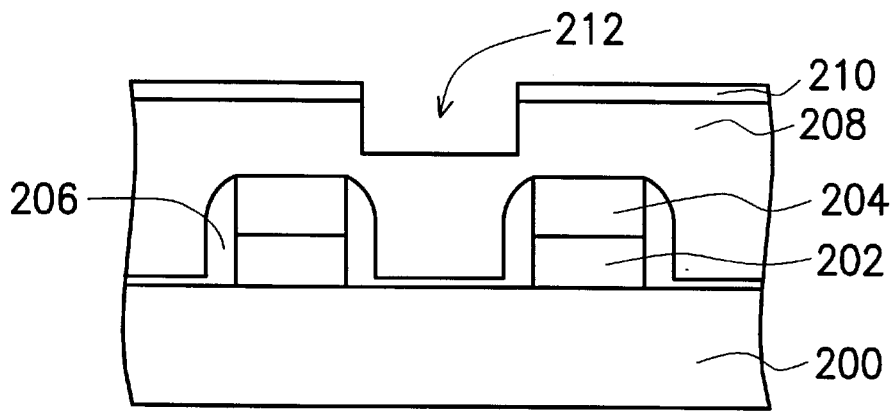

As shown in FIG. 2B, the cap layer 210 and the dielectric layer 208 are patterned to form a trench 212. The trench 212 forms a desired bit line pattern without exposing the word line 202 or the substrate 200.

Figure 2C:
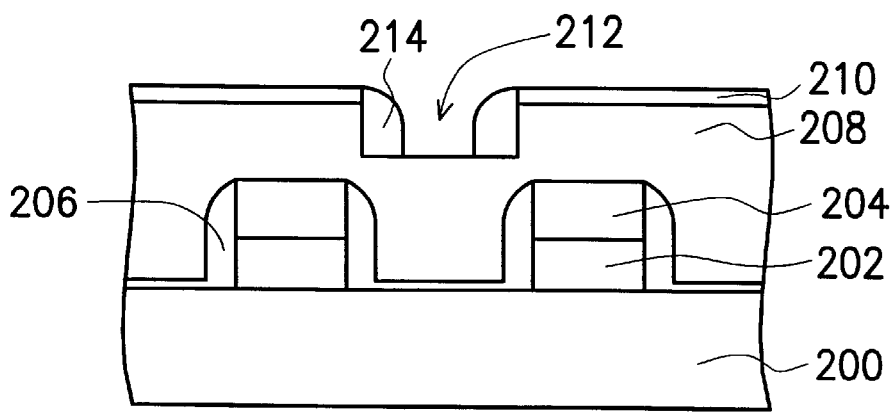

As shown in FIG. 2C, silicon nitride spacers 214 are formed on the sidewalls of the trench 212. The spacers 214 can be formed by, for example, performing a chemical vapor deposition to form a conformal silicon nitride layer (not shown in the figure) over the exposed dielectric layer 208. This is followed by performing an anisotropic etching back of the silicon nitride layer.

Figure 2D:
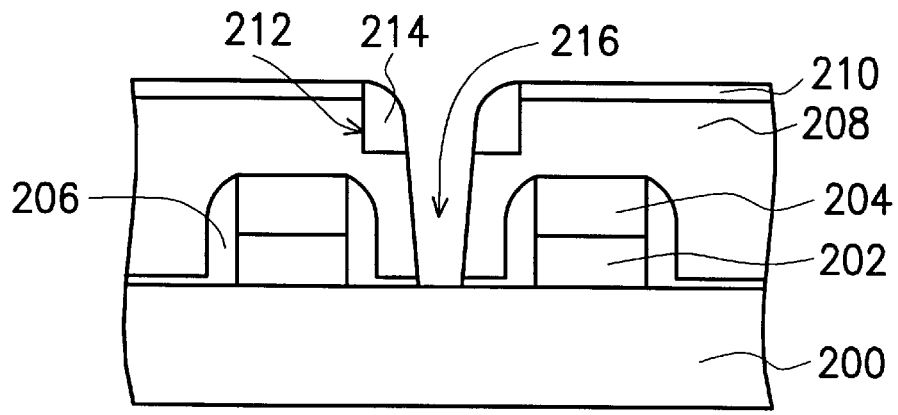

As shown in FIG. 2D, a contact window 216 is formed below the trench 212 to expose a portion of the substrate 200 by, for example, performing conventional photolithographic and etching processes.

Figure 2E:
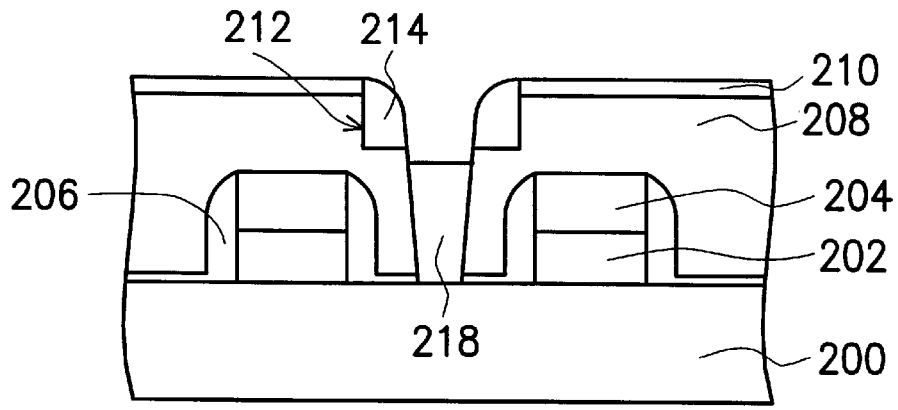

As shown in FIG. 2E, polysilicon is deposited into the contact window 216 to form a polysilicon plug 218. The polysilicon plug 218 can be formed by, for example, performing chemical vapor deposition to fill the contact window 216 and the trench 212 and cover the cap layer 210. The polysilicon layer is subsequently etched back in an anisotropic etching operation to form the polysilicon plug 218.

Figure 2F:
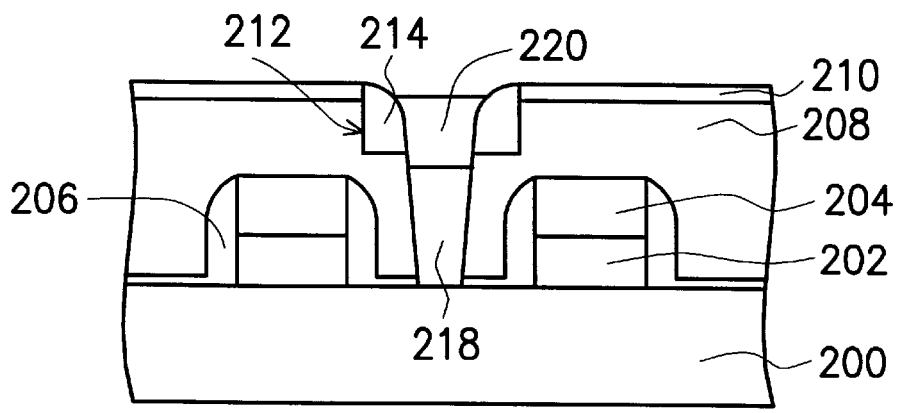

As shown in FIG. 2F, a metal silicide layer 220 is formed over the polysilicon plug 218. The metal silicide layer 220 can be formed by, for example, performing chemical vapor deposition to form a metal silicide layer that fills the trench 212 and covers the cap layer 210. A chemical-mechanical polishing method or an etching back method is carried out to remove redundant silicide material on top, thereby forming a complete bit line 220.

The bit line can also be constructed by a damascene process. For example, metal is deposited into the contact window 216 and the bit line trench 212. A chemical-mechanical polishing operation is next carried out to remove redundant metallic material outside the contact window 216 and the bit line trench 212 so that a bit line and a bit line contact are formed at the same time.

Figure 3A:
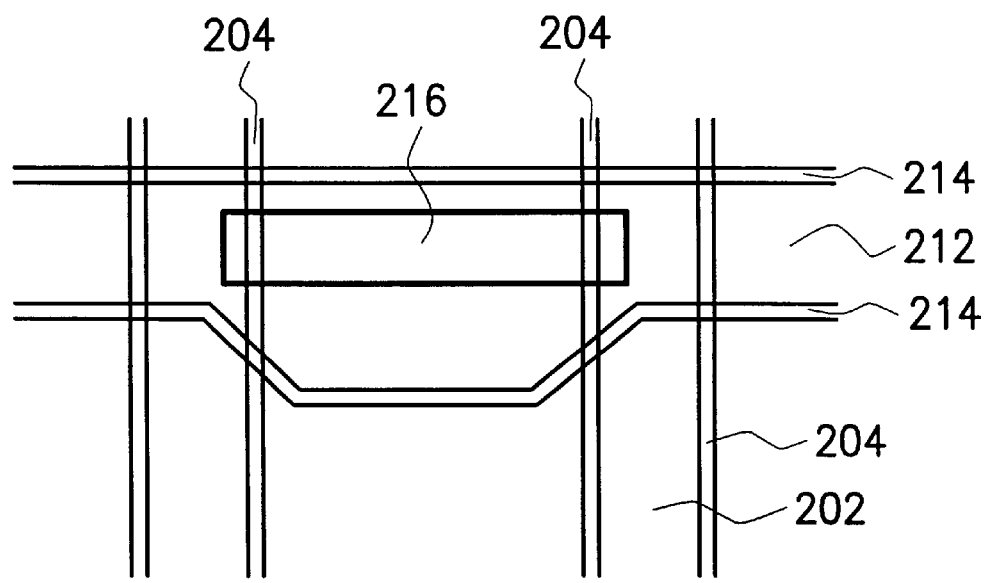
FIGS. 3A and 3B are schematic top views illustrating two of the possible types of bit line and bit line contact window arrangements of this invention.
Figure 3B:
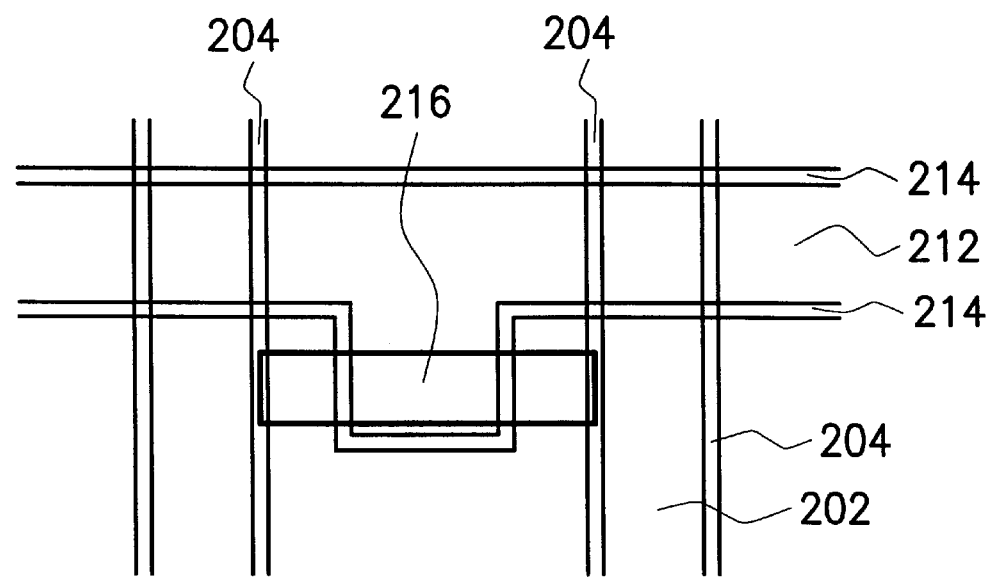

In this invention, since the word line 202 is only covered by silicon oxide sidewall spacers 206, areas not covered by silicon nitride spacers 214 are likely to be etched away in the contact window etching operation. Consequently, contact windows must be positioned outside the oxide spacer regions. FIGS. 3A and 3B are schematic top views illustrating two of the possible types of bit line and bit line contact window arrangements of this invention. In FIG. 3A, the contact window 216 covers a portion of the word line 202. Hence, the oxide spacers are removed and an electrical contact with the word line 202 is formed. On the other hand, in FIG. 3B, the contact window 216 is formed in locations outside the oxide spacers. Therefore, the oxide spacers are spared and any electrical contact with word line 202 is avoided.

In summary, the advantages of the invention at least includes:

1. Oxide spacers are formed on the sidewalls of polysilicon word lines. Because stress at the junction between a silicon oxide layer and a polysilicon layer is considerably smaller than between a silicon nitride layer and a polysilicon layer, dislocations caused by the presence of silicon nitride spacers are greatly reduced.

2. The bit line is located inside a trench in the dielectric layer. Therefore, a bit line thickness can be subtracted. In addition, since there is no silicon nitride layer on top of the gate terminal, thickness of the dielectric layer can be further reduced. Consequently, overall thickness of a device is reduced and processing window is increased.

3. By forming silicon nitride spacers on the sidewalls of a trench, a narrower contact window can be formed so that the level of device integration can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a bit line and a bit line contact, comprising the steps of:

providing a semiconductor substrate having a word line thereon;

forming oxide spacers on sidewalls of the word line;

forming a dielectric layer over the substrate and the word line;

planarizing the dielectric layer;

forming a cap layer over the dielectric layer;

patterning the cap layer and the dielectric layer to form a bit line trench in the dielectric layer without penetrating through the dielectric layer;

forming silicon nitride spacers on sidewalls of the bit line trench;

patterning the dielectric layer exposed by the bit line trench to form a contact window that exposes a portion of the substrate;

depositing polysilicon into the contact window to form a polysilicon plug; and depositing metal silicide into the trench to form a metal silicide layer.

2. The method of claim 1, wherein the step of forming the oxide spacers includes depositing silicon dioxide.

3. The method of claim 1, wherein the step of forming the cap layer includes deposition of silicon nitride.

4. The method of claim 1, wherein a material for forming the word line includes polysilicon.

5. The method of claim 1, wherein the word line has a metal silicide layer on top.

6. The method of claim 1, wherein the contact windows are formed in regions away from the oxide spacers.

7. A method for manufacturing a bit line and a bit line contact, comprising the steps of:

providing a semiconductor substrate having a word line with oxide sidewall spacers;

forming a dielectric layer over the substrate and the word line;

planarizing the dielectric layer;

forming a cap layer over the dielectric layer;

patterning the cap layer and the dielectric layer to form a bit line trench in the dielectric layer without penetrating through the dielectric layer;

forming silicon nitride spacers on sidewalls of the bit line trench;

patterning the dielectric layer exposed by the bit line trench to form a contact window that exposes a portion of the substrate; and depositing conductive material into the contact window and the to form a conductive layer.

8. The method of claim 7, wherein the step of forming the oxide spacers includes depositing silicon dioxide.

9. The method of claim 7, wherein the step of forming the cap layer includes deposition silicon nitride.

10. The method of claim 7, wherein material for forming the word line includes polysilicon.

11. The method of claim 7, wherein the word line has a metal silicide layer on top.

12. The method of claim 11, wherein the metal silicide includes a tungsten silicide.

13. The method of claim 7, wherein the contact windows are formed in regions away from the oxide spacers.

* * * * *